US009048052B2

(12) United States Patent
Kaynak et al.

(10) Patent No.: US 9,048,052 B2
(45) Date of Patent: Jun. 2, 2015

(54) ELECTROMECHANICAL MICROSWITCH FOR SWITCHING AN ELECTRICAL SIGNAL, MICROELECTROMECHANICAL SYSTEM, INTEGRATED CIRCUIT, AND METHOD FOR PRODUCING AN INTEGRATED CIRCUIT

(75) Inventors: Mehmet Kaynak, Frankfurt (DE); Mario Birkholz, Frankfurt (DE); Bernd Tillack, Frankfurt (DE); Karl-Ernst Ehwald, Frankfurt (DE); René Scholz, Halle (DE)

(73) Assignee: IHP GmbH—INNOVATIONS FOR HIGH PERFORMANCE MICROELECTRONICS/LIEBNIZ-INSTITUT FUR INNOVATIVE MIKROELEKTRONIK, Frankfurt (Oder) (DE)

( * ) Notice: Subject to any disclaimer, the term of this patent is extended or adjusted under 35 U.S.C. 154(b) by 0 days.

(21) Appl. No.: 13/514,106

(22) PCT Filed: Dec. 7, 2010

(86) PCT No.: PCT/EP2010/069019

§ 371 (c)(1), (2), (4) Date: Jul. 12, 2012

(87) PCT Pub. No.: WO2011/069988

PCT Pub. Date: Jun. 16, 2011

(65) Prior Publication Data

US 2012/0280393 A1 Nov. 8, 2012

(30) Foreign Application Priority Data

Dec. 7, 2009 (DE) ........................ 10 2009 047 599

(51) Int. Cl.

| | |
|---|---|
| ***H01L 23/48*** | (2006.01) |
| ***H01H 59/00*** | (2006.01) |
| *H01H 1/00* | (2006.01) |

(52) U.S. Cl.

CPC ......... *H01H 59/0009* (2013.01); *H01H 1/0036* (2013.01)

(58) Field of Classification Search

CPC .................... B81B 2201/01; B81B 2201/016; B81C 1/00857

USPC ...................... 257/750, 415, 751; 438/50, 52

See application file for complete search history.

(56) References Cited

U.S. PATENT DOCUMENTS

| | | | |
|---|---|---|---|
| 6,529,093 | B2 | 3/2003 | Ma |
| 6,639,488 | B2 | 10/2003 | Deligianni et al. |

(Continued)

FOREIGN PATENT DOCUMENTS

| | | |
|---|---|---|
| DE | 4437259 | 10/1995 |
| DE | 10 2005 016243 | 9/2006 |

(Continued)

*Primary Examiner* — Mamadou Diallo
*Assistant Examiner* — Christina Sylvia
(74) *Attorney, Agent, or Firm* — Ware, Fressola, Maguire & Barber LLP

(57) ABSTRACT

The invention relates to a microelectromechanical system with an electromechanical microswitch for switching an electrical signal in particular a radio frequency signal, in particular in a GHz range, comprising a multi-level conductive path layer stack arranged on a substrate, wherein conductive paths of the multi-level conductive path layer stack arranged in different conductive levels are insulated from one another through electrically insulating layers and electrically connected with one another through via contacts, an electromechanical switch which is integrated in a recess of the multi-level conductive path layer stack and which includes a contact pivot, an opposite contact and at least one drive electrode for the contact pivot, wherein the contact pivot, the opposite contact and the at least one drive electrode respectively form a portion of a conductive level of the multi-level layer stack.

22 Claims, 10 Drawing Sheets

(56) References Cited

U.S. PATENT DOCUMENTS

| | | | | |
|---|---|---|---|---|
| 6,667,245 | B2 | 12/2003 | Chow et al. | |
| 7,202,101 | B2 | 4/2007 | Gabriel et al. | |
| 2002/0124385 | A1* | 9/2002 | Tsai et al. | 29/622 |
| 2005/0248423 | A1 | 11/2005 | Qian et al. | |
| 2006/0012940 | A1 | 1/2006 | Song et al. | |
| 2006/0056132 | A1* | 3/2006 | Yoshida et al. | 361/294 |
| 2007/0018761 | A1 | 1/2007 | Yamanaka et al. | |
| 2009/0146226 | A1 | 6/2009 | Bozler | |
| 2009/0285419 | A1* | 11/2009 | Shih et al. | 381/174 |
| 2009/0296307 | A1 | 12/2009 | Siamak et al. | |
| 2010/0207216 | A1* | 8/2010 | Drews et al. | 257/415 |

FOREIGN PATENT DOCUMENTS

| | | |
|---|---|---|
| DE | 10 2006 061386 | 6/2008 |
| DE | 10 2007 031128 | 1/2009 |
| EP | 1321957 | 6/2003 |
| EP | 1677328 | 7/2006 |
| WO | WO 2006/120810 | 11/2006 |
| WO | WO 2009/003958 | 1/2009 |

* cited by examiner

ELECTROMECHANICAL MICROSWITCH FOR SWITCHING AN ELECTRICAL SIGNAL, MICROELECTROMECHANICAL SYSTEM, INTEGRATED CIRCUIT, AND METHOD FOR PRODUCING AN INTEGRATED CIRCUIT

CROSS REFERENCE TO RELATED APPLICATIONS

This application is the U.S. National Stage of International Application Number PCT/EP2010/069019 filed on Dec. 7, 2010 which was published on Jun. 16, 2011 under International Publication Number WO 2011/069988, and which claims priority to DE 10 2009 047 559.0, filed on Dec. 7, 2009.

TECHNICAL FIELD

The invention relates to a microelectromechanical system. Furthermore, the invention relates to an integrated circuit with a microelectromechanical system of this type and a method for producing an integrated circuit.

BACKGROUND OF THE INVENTION

A microelectromechanical system by applicant is known e.g. from WO 2009/003958.

An electromechanical microswitch as described in U.S. Pat. No. 6,529,093 can be used for switching a radio frequency signal, in particular in GHz range. In particular for microelectronic circuits which are timed with very high frequencies in the GHz range, it is very helpful to have electromechanical microswitches which facilitate switching electrical connections on and off in a controlled manner. In U.S. Pat. No. 6,529,093 recited supra, a micromechanical switch is described which is made from a cantilever made from polysilicon and which is driven by an electrode arrangement to which an electrical potential is applied. Besides the electrode arrangement for driving the cantilever, a second electrode arrangement is provided therein for switching the RF signal. At least one of the electrodes of an electrode pair is thus provided with a dielectrical layer. The cantilever can thus also be configured as a bridge that is clamped on both sides. The layer configuration required for implementing the microswitch thus includes partially applied layers made from a dielectric material, conductors and polysilicon. Also in U.S. Pat. No. 6,639,488 a microswitch is described whose layer configuration is characterized by applying various dielectric and electrically conductive layers. Though in both documents production methods are used which are designated as CMOS compatible, they require method steps for producing the microswitches which are not required for producing microelectronic circuits.

In particular in circuits which are produced through the CMOS technology that is typically used in the semiconductor industry and which circuits are being used in wireless data transmissions and communications, typically electromechanical switches are being used which cannot be integrated together with electronic circuits on one chip. It would be much more cost-effective and advantageous in order to achieve further miniaturization to provide an electromechanical microswitch which is furthermore provided in a CMOS compatible manner so that an electromechanical microswitch can simultaneously be produced with the microelectronic circuit.

In view of this fact, it is important to generally understand the CMOS production process which is divided into a frontend of line (FEoL) portion and a back-end of line (BEoL) portion. While the process steps of the FEoL portion relate to producing the transistors directly on the surface of the silicon substrate, the transistors are connected with one another through electrical conductors in the BEoL portion. In particular, such connections are produced from the structuring of horizontal metal planes and vertical conductors (so-called Vias) which are embedded into electrically insulating layers between the horizontal metal planes. Thus, the processes performed in the two portions FEoL and BEoL differ substantially with respect to their thermal budget, in particular with respect to the level and duration of the process temperatures used. Thus, very high process temperatures occur in the FEoL portion, which are not reached again in the BEoL portion in order not to destroy the complex transistor build ups through the inter-diffusion processes.

As described supra, the recited solutions implement an electromechanical microswitch based on silicon, wherein the microswitch has to be produced through FEoL processes. From a process technology point of view, producing an electromechanical microswitch in the BEoL portion is much more advantageous.

U.S. Pat. No. 6,667,245 describes a method for producing a MEMS-RF switch in which Vias are being used as structural elements of a switch in the BEoL process.

SUMMARY OF THE INVENTION

Based on this, it is an object of the invention to provide a device for switching an electrical signal and a method for producing the device which are configured so that a production can be provided CMOS process compatible in the BEoL portion. In particular, the device shall be configured for switching signals, in particular radio frequency signals in the GHz range.

With respect to the device, the object of the invention is achieved through a microelectromechanical system (MEMS) with an electromechanical microswitch for switching an electrical signal, in particular a radio frequency signal (RFMEMS), in particular in GHz range, the electromechanical system including:

- a multi-level conductive layer stack arranged on the substrate, in particular silicon substrate, wherein the conductive paths of the conductive path layer stack are insulated relative to one another through electrically insulating layers and are electrically connected with one another through Via contacts, in particular also connected with electrical circuits which can be arranged on/in the substrate or similar;
- an electromechanical switch with a contact pivot, which electromechanical switch is integrated in a recess of the multi-level conductive path layer stack, an opposite contact and at least one drive electrode for the contact pivot, wherein the contact pivot, the opposite contact and the at least one drive electrode respectively form a portion of a conductive level of the multi-level conductive path layer stack.

The microelectromechanical system (MEMS) is configured in particular for switching an electrical signal configured as a radiofrequency signal as a radio frequency microelectromechanical system (RFMEMS) in particular for switching high frequency signals in the GHz range.

The invention also relates to an integration of an electronic circuit with a microelectromechanical system, wherein the electrical circuit is preferably configured as an integrated CMOS circuit in order to achieve the object of the invention.

The object is achieved through the method recited supra, wherein the integrated circuit is produced through a CMOS method including the following steps:

producing the integrated circuit in an FEoL process together with a plurality of circuit elements; and electrically contacting the electronic circuit elements in a BEoL process, wherein according to the invention the electromechanical microswitch is integrated in a BEoL process in a recess of the multi-level conductive path stack and the contact pivot, the opposite contact and the at least one drive electrode activating the contact pivot respectively form a portion of the conductive path of the multi-level conductive path layer stack.

The invention is based on the idea that approaches used so far to implement a micromechanical switch based on silicon or made from solid silicon material are not suitable to configure a micorelectromechanical switch in a CMOS compatible manner in a BEoL portion. The inventors have found that it is possible to advantageously integrate an electromechanical microswitch in a BEoL portion through a suitable choice of microswitch materials using the layer sequence used for connecting the electromechanical components. The inventors have also found that it is feasible through the process technologies that have become available in recent years to integrate or implement suitable electromechanical microswitches in microelectromechanical systems as it is known in principle e.g. from WO 2009/003958. Thus, electromechanical system technologies of the applicant have related to developing mechanically movable structures from solid material, in particular from silicon wafers.

Using a layer sequence for configuring the electromechanical microswitch according to the invention leads to an advantageous configuration of the particular functional elements of the electromechanical microswitch, thus e.g. the contact pivot, the opposite contact and the drive electrodes for the contact. The contact pivot is advantageously elastically movable and configured conductive. The opposite contact is advantageously configured at a distance from the contact pivot, in particular in the form of a solid and rigid opposite contact pedestal.

The microswitch within the microelectromechanical system is advantageously produced so that the contact pivot is movable through one or plural provided drive electrodes which can be arranged below or above the contact pivot with reference to the surface e.g. of the silicon substrate. This is provided by applying an electrical potential between the at least one drive electrode and the contact pivot so that an elastic movement of the contact pivot is performed as a function of the electrostatic forces and the capacitive coupling is changed through the contact between the opposite contact and the contact pivot. This causes a switching of the electrical signal which can be run on the opposite contact and/or the contact pivot. Advantageously, the contact pivot can be connected to ground and the opposite contact can be run between different potentials, for a decreasing distance between the contact pivot and the opposite contact, thus a capacitive coupling of the signal conduction with ground is provided.

An embodiment of the invention advantageously provides a combination of two measures which have additionally proven particularly advantageous for the function of the electromechanical microswitch. On the one hand side, it can be provided that the opposite contact (pedestal) includes a metal-insulator-metal (MIM) structure at a distal end oriented towards the contact pivot (actuator). This embodiment facilitates using an MIM structure of this type among other things for protecting the opposite contact and also for improving the contact performance, possibly expanding the frequency range. Thus, in particular the switching properties of the electromechanical microswitch can be advantageously configured.

It can furthermore be provided that the drive electrode (configured as a portion of a conductive layer of the conductive path layer stack) moving the contact pivot includes a structure including knobs with dielectric material on a side oriented towards the contact pivot. These knobs as implemented in the embodiment can be produced within a process step for exposing an electrode of a conductive path without requiring a separate process step for implementing the knob structure. As a matter of principle, the knob structure is advantageously configured to prevent unintentional contacting between the drive electrode and the contact pivot, thus an undesired short circuit. Additionally, the knobs are configured to support the drive electrode in the portion of the drive electrode or to implement a stop for the contact pivot. This process step for producing the knobs can be provided e.g. during a wet etching step and optionally during a subsequent $CO_2$ drying process. Additional process steps for implementing the knob structure are not required. With respect to the structure including knobs made from dielectric material, it has proven particularly advantageous in the context of the production method that the dielectric material is formed as an oxide of a material of a conductive path of the multi-layer conductive path stack, in particular through wet chemical etching.

Additional advantageous embodiments of the invention can be derived from the dependent claims and provide advantageous embodiments to implement the concept described supra to achieve the object and to achieve the recited and additional advantages.

It has proven particularly advantageous that the contact pivot is configured as a cantilever, e.g. in the form of a unilateral spring or bridge. A bridge or spring (cantilever) can be provided e.g. with comparatively well-configured elastic properties in order to advantageously configure the elastic movement of the contact pivot for switching the signal. For this purpose, the contact pivot can be provided with recesses. In particular, the contact pivot for integrating the electromechanical microswitch can be provided with an electronic circuit on a chip through structuring a conductive level of the multi-level conductive path layer stack with one or plural end side fixation supports. A fixation support is configured for example as an outrigger of the contact pivot. Thus, it is advantageous to arrange the outriggers at an angle relative to one another that is different from 0° or 180° degrees in order to lock degrees of freedom of the movement of the contact pivot and in order to allow only one movement in switching direction. Two respective end side outriggers of the contact pivot have proven advantageous for forming fixation supports which are arranged at an angle of approximately 90° relative to one another.

In a particularly advantageous manner, the contact pivot includes at least one attractive portion that can be differentiated from the contact zone. The contact zone is thus associated with the opposite contact and is used for capacitive coupling of contact pivot and opposite contact. The at least one attractive portion, however, is associated with the activating drive electrode and is used for activation, that means force impact onto the contact pivot in order to set the contact pivot in motion.

The contact pivot is advantageously formed by structuring a conductive level of the multi-level conductive path stack and is preferably made from metal material, e.g. aluminum. Implementing the contact pivot from a metal conductive path of the multi-level conductive path stack can be advantageously integrated into the BEoL process.

As a matter of principle, one or more drive electrodes can be provided that activate the contact pivot and/or activate the contact pivot in another direction, wherein the drive electrodes are advantageously configured from the structuring of a conductive level of the multi-level conductive path stack. For example, a particularly advantageous embodiment can include a drive electrode that activates the contact pivot, wherein the drive electrode is arranged below the contact pivot with respect to the surface of the silicon substrate. This embodiment causes the contact pivot to be moved into a "down condition" for closing the switch and into an "up condition" for opening the switch. For improving the switching properties, additionally or alternatively, another drive electrode which activates and/or counter-activates the contact pivot can be arranged at a distance with respect to the surface of the silicon substrate above the contact pivot. In case the drive electrode that is oriented away from the substrate and arranged above the contact pivot is provided in addition to the lower substrate side drive electrode, the upper drive electrode is used as a pullback electrode. Thus, the movement of the contact pivot from the "down condition" into the "up condition" can be accelerated.

In a preferred manner, various conductive levels of the multi-level conductive path layer stack e.g. made from aluminum are simultaneously configured as carrier layers for the contact pivot, the opposite contact, the activating and/or counter-activating drive electrodes of the electromechanical microswitch. In a particularly preferred manner, the metal conductive levels can be coated at least on one side, preferably on both sides. In a particularly preferred embodiment, this applies for all metal conductive levels forming the electromechanical microswitch at least in the portion of the contact, the opposite contact, the activating drive electrode and the counter-activating drive electrode. The coating is presently advantageously formed by one or plural layers with TiN and/or Ti and/or AlCu. In particular a double layer from TiN—Ti has proven advantageous or a sandwich made from TiN—AlCu—TiN.

In a preferred embodiment, the base of the opposite contact is formed from insulating material. It has become apparent that when producing the multi-level conductive path layer stack, the insulating material arranged between the conductive levels, for example a dielectric material, preferably $Si_3N_4$ can also be advantageously used for forming the base of the opposite contact. In a particularly advantageous manner, the base of the opposite contact is formed from a sequence of a first metal conductive level, an insulating material placed thereon and a second metal conductive level.

The metal layer of the opposite contact has particularly advantageous switching properties with respect to the contact with the contact surface of the contact pivot.

Furthermore, applying an MIM structure (metal-insulator-metal structure) on a base for forming a distal end of the opposite contact is advantageous. Thus, it has proven advantageous in particular that the MIM structure includes:

a barrier layer made from conductive material oriented towards the base, in particular a metal material;

a conductive cap at the distal end, which cap is oriented towards the contact pivot; and a dielectric layer arranged there between.

The barrier layer is advantageously used as a protection between a metal layer that is applied to the base of the opposite contact and conducts a signal, and the dielectric layer of the MIM structure. The cap of the MIM structure is advantageously used for protecting the opposite contact. Advantageously, as a variation of this embodiment, the cap is provided with a higher layer thickness than the barrier layer. This facilitates that in a "down condition" of the contact, a reliably defined and comparatively low capacity is implemented. In order to further improve contact properties, the conductive cap, in particular the metal cap, can also be provided in the form of a metal layer structure which can be implemented as required. The barrier layer can advantageously be of the same type as the cap. The insulating dielectric layer of the MIM structure is advantageously made from $Si_3N_4$.

In a particularly preferred manner, the contact pivot and/or the cap can be formed from a metal conductive layer or from a layer combination which includes material based on titanium nitrite and/or titanium, in particular from a titanium nitrite material or pure titanium. In particular, in a "down condition" of the electromechanical microswitch, a titanium nitrite-titanium nitrite (TiN—TiN) contact or a TiN—Ti contact have proven comparatively wear resistant.

Thus, the contact pivot and/or the cap can be formed from one or plural layers Ti, TiN, and/or AlCu. These material combinations have proven to be easily processable, extremely wear resistant in a "down condition" and advantageous with respect to the shifting properties. A sandwich structure made from TiN—AlCu—TiN has proven particularly advantageous for implementing the contact pivot and the cap. Thus, it is advantageous that the entire conductive levels of the conductive path layer stack are configured in this sandwich structure, thus also in the portions where structured conductive levels are used for electrically connecting electronic circuits.

In another preferred embodiment, a distance of a conductor arrangement (drive electrode) activating the contact pivot from the contact is selected greater than a distance of the contact pivot from the opposite contact. Put differently, a distance between the opposite contact and the contact is smaller than a distance between a drive electrode and the contact pivot. Thus a "pull in effect", this means an over-rotation of the contact pivot from the "up condition" into the "down condition" when closing the switch is advantageously counteracted.

In a particularly preferred embodiment, the distance between the opposite contact and the contact zone of the contact pivot and the capacity of the MIM structure on the opposite contact can be sized so that over the entire distance during the movement of the contact between an "up condition" and a "down condition", a substantially proportional capacity diagram is achieved as a function of the activation voltage between the drive electrode and the contact pivot. The electromechanical microswitch is advantageously usable in one embodiment as a variable capacity with a defined control voltage diagram.

Embodiments of the invention are subsequently described based on the drawing figure. The drawing figure does not necessarily illustrate embodiments to scale; rather the drawing is provided schematically or slightly distorted where this improves understanding. With respect to supplementation of the teachings that are directly apparent from the drawing figures, pertinent prior art is incorporated by reference. Thus it is appreciated that many modifications and changes with respect to the shape and the detail of an embodiment can be provided without deviating from the general concept of the invention. The features of the invention disclosed in the drawing and in the claims can be implemented in advantageous embodiments of the invention by themselves and also in any combination. Furthermore, all combinations of at least two features disclosed in the description, the drawing and/or in the claims are within the scope of the invention. The general idea of the invention is not limited to the exact shape or the detail of the subsequently illustrated and described advantageous embodiment or limited to an object which is narrowed compared to the object claimed in the patent claims. In disclosed ranges, also the values disposed within the recited ranges shall be disclosed as threshold values and shall be usable and claimable at will. For simplicity reasons, identical or like elements or elements with identical or like function are used with identical reference numerals.

BRIEF DESCRIPTION OF THE DRAWINGS

Other advantages, features and details of the invention can be derived from the subsequent description of the preferred embodiments or from the drawing figure, wherein.

DETAILED DESCRIPTION

Figure 4A:
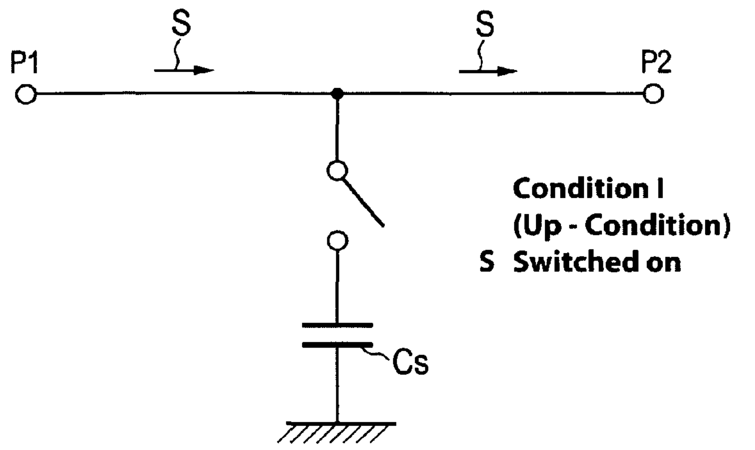
FIGS. 4A, 4B, 4C illustrate a block diagram of the microswitch of FIG. 3 with illustrated signal paths.
Figure 4B:
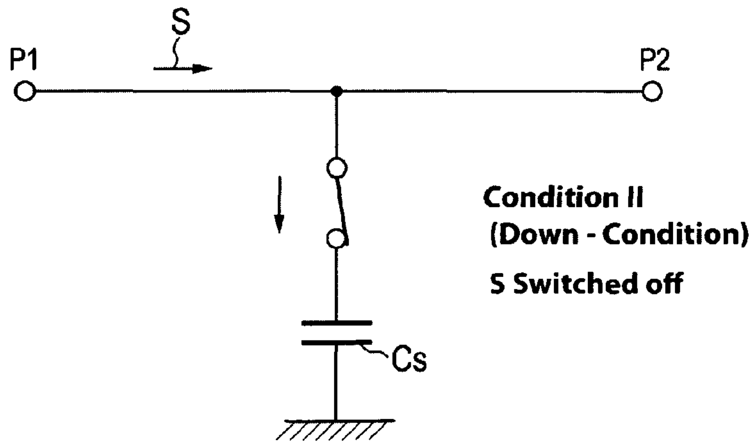
Figure 4C:
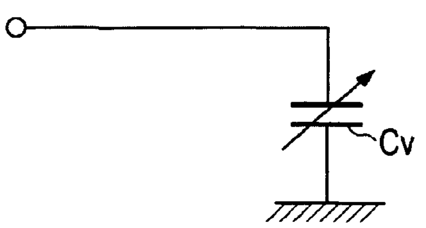
Figure 5:
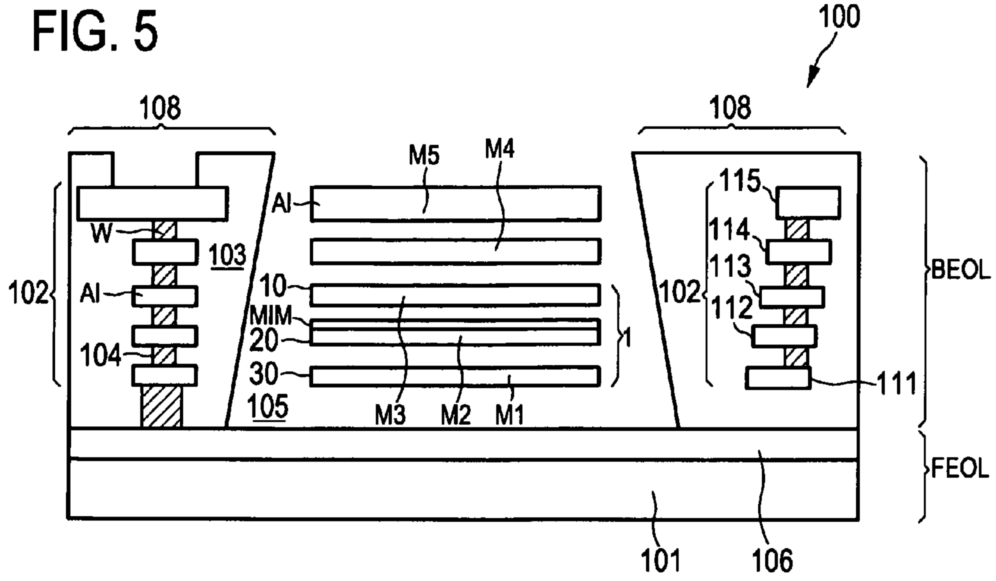
FIGS. 5, 6 illustrate a side view of a first preferred embodiment of an MEMS with an electromechanical microswitch arranging the contact pivot, the opposite contact and the drive electrode relative to the particular conductive levels of the multi-level conductive path stack of the MEMS or of the microelectromechanical system for radio frequency signals (RF MEMS) and a modified advantageous embodiment which is additionally provided with a pullback electrode.
Figure 6:
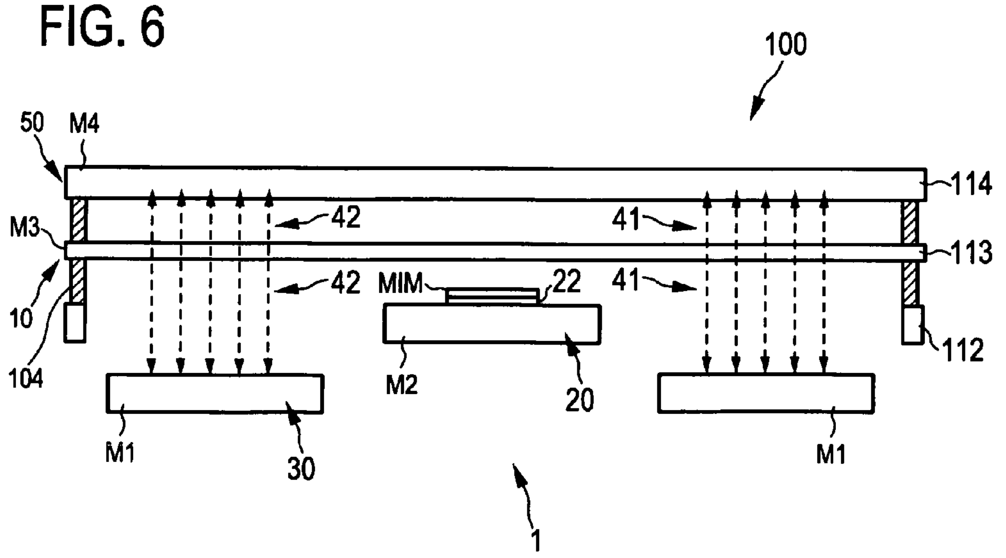
Figure 7:
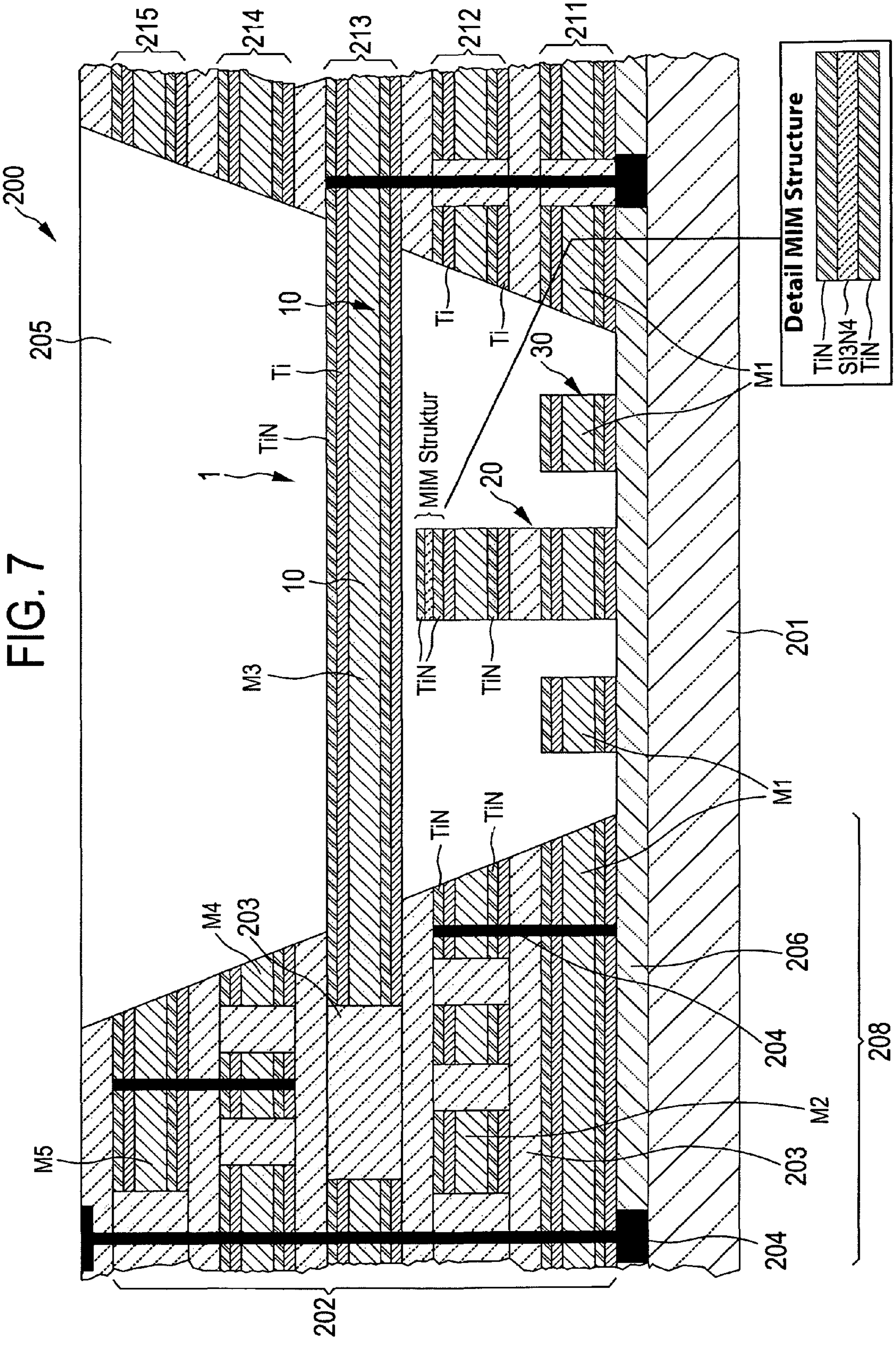
FIG. 7 illustrates a second preferred embodiment of an MEMS with a particularly preferred layer sequence of the conductive levels of the multi-level conductive path layer stack of the MEMS.

The microswitch illustrated in FIG. 1 through FIG. 4*c* in more detail, according to the concept of the invention as illustrated in a first embodiment in FIG. 5 and in a variation thereof in FIG. 6 or also in a second embodiment of the MEMS as illustrated in FIG. 7 can be provided by structuring the conductive levels of a multi-level conductive path layer stack.

Thus, FIG. 1 through FIG. 4*c* and also the embodiments of FIG. 8A through FIG. 8D and FIG. 9 illustrate details of a preferred embodiment of an MEMS.

Figure 1:
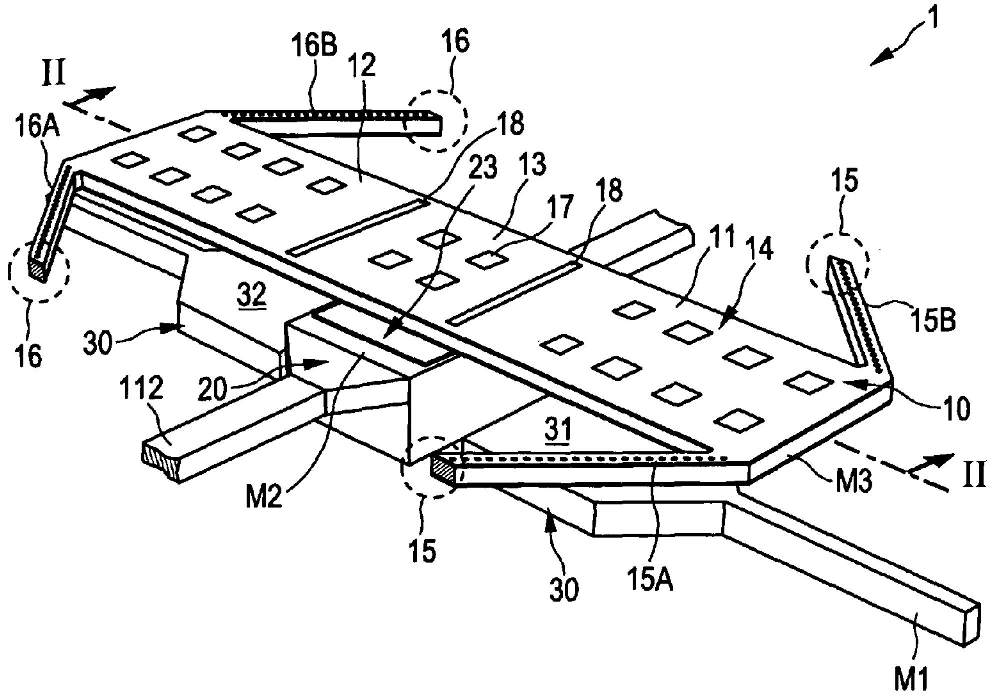
FIG. 1 illustrates a perspective view of an electromechanical microswitch according to a particularly preferred embodiment for a MEMS.

The electromechanical microswitch 1 illustrated in FIG. 1 includes a self-supporting elastically movable conductive contact pivot 10, and opposite contact 20 and a drive electrode activating the contact pivot 10. The contact pivot 10 is presently formed as a bridge 14 which has a contact zone 13 and a first attractive portion 11 and a second attractive portion 12. The attractive portions 11, 12 are respectively associated with a first and a second portion 31, 32 of the activating drive electrode; this means arranged opposite of one another. The distal end 23 of the opposite contact 20 is arranged opposite from the contact zone 13 of the bridge 14. The contact pivot 10 includes two respective outriggers 15*a*, 15*b* or 16*a*, 16*b* at an end of the bridge 14, wherein the outriggers fixate the bridge 14 at the end portion of the attractive portions 11, 12. Thus the outriggers 15*b*, 16*b* or 15*a*, 16*a* extend from a common fixation point in various directions and are supported with its attachment sections 15, 16 in the semiconductor material of a CMOS chip symbolically illustrated in FIG. 11.

When applying an electrical potential between the drive electrode 30 and the contact pivot 10, the contact pivot 10 is caused to perform an elastic movement which changes a capacitive coupling of the contact zone 13 of the contact pivot 10 with the opposite contact 20 and is thus configured to switch and electrical signal S in the conductive path 112.

Figure 2:
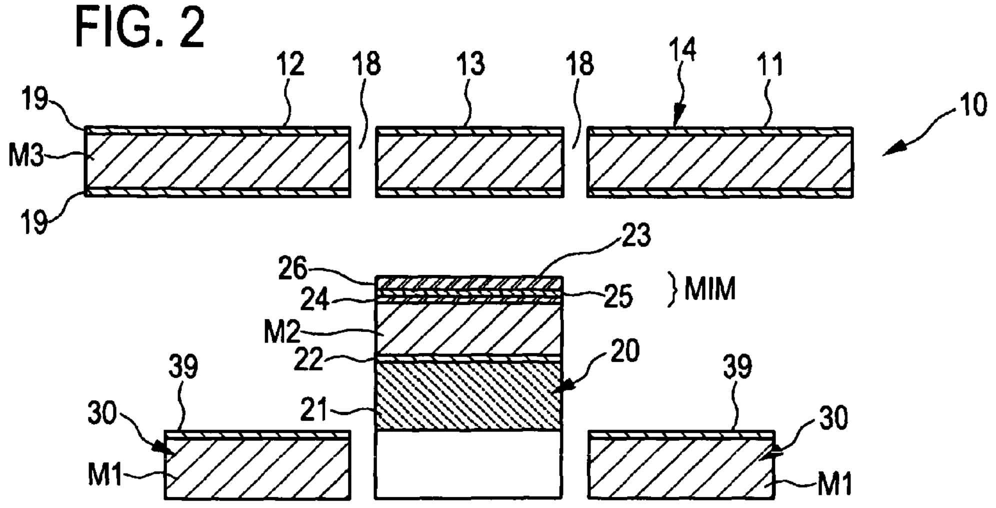
FIG. 2 illustrates a schematic sectional view of the electromechanical microswitch for emphasizing the configuration of the contact pivot, the opposite contact and the activating drive electrode in the preferred embodiment.

FIG. 2 illustrates the electromechanical microswitch along the sectional line II-II in FIG. 1, wherein the configuration of the conductive paths for forming the contact pivot 10, the contact 20 and the drive electrode 30 is illustrated in more detail and described infra. FIG. 3 and FIG. 4*a*, FIG. 4*b*, FIG. 4*c* describe the function of the microswitch.

Figure 3:
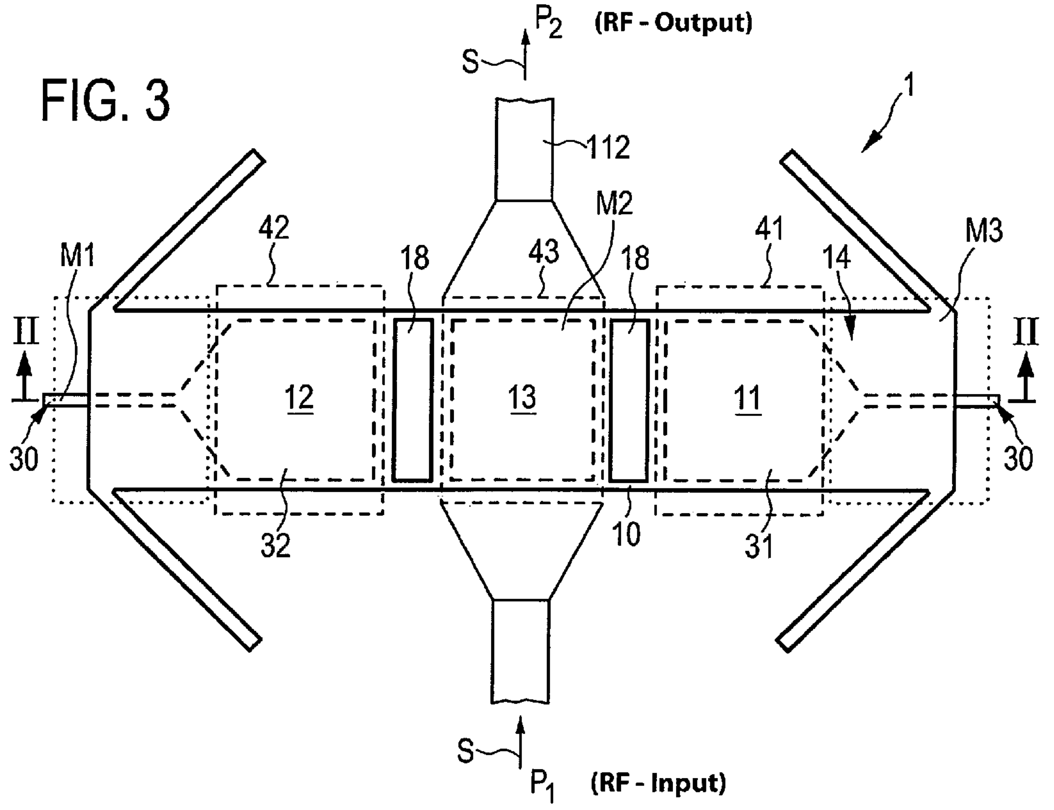
FIG. 3 illustrates a schematic top view of the electromechanical microswitch of FIG. 1 as a portion of the MEMS for emphasizing the function and the signal paths.

As apparent from FIG. 2 and FIG. 3, the electromechanical microswitch 1 of the present embodiment is characterized in that the attractive portions 11, 12 of the contact pivot 10 are separated from the contact zone 13 of the contact pivot 10 by slots 18 or the contact zone 13 is separately arranged between the attractive portions 11, 12. This way a separate portion 43 is configured which influences the signal S, whose size is essentially determined through the contact zone 13 and the flat distal end 23 of the opposite contact 20. The portion 43 is thus separated from the portions 41, 42 transferring electrical forces, wherein the separation is provided respectively between an attractive portion 11, 12 or a portion 31, 32 of the activating drive electrode 30.

As a block diagram, FIG. 4A illustrates an "up condition" (I) of the electromechanical microswitch 1 in which a radio frequency signal runs through the opposite contact 20 from P1 to P2 without the capacity between the opposite contact 20 and the contact zone 13 being capable of substantially influencing the signal S. (II) in FIG. 4B symbolically illustrates the signal connection of an RF signal for the "down condition" of the contact 10. Presently, the RF signal, due to the existing capacitive or contacting coupling of the opposite contact 20 and contact zone 13, finds its way to a mass connection which is applied to the contact pivot 10.

In order to facilitate an elastic movement of the contact pivot 10 in a preferred dynamic range, the contact pivot 10 as evident from FIG. 1 is provided with a plurality of recesses 17 or slots 18 which reduce the resistance moment of the spring effect of the contact pivot 10. The slots 18 are furthermore used for the separation recited supra between the attractive portions 11, 12 and the contact zone 13 of the bridge 14. In case of the "up condition" of the electromechanical microswitch 1, this means in case of low capacitive coupling with the transmitted signal, the capacity between the opposite contact 20 and the contact pivot 10 is approximately 50 to 500 fF. In a "down condition" of the electromechanical microswitch 1, the capacity between the opposite contact 20 with an MIM structure at the distal end 23 and the contact zone 13 is approximately 1 to 10 pF.

The preferred configuration of the contact pivot 10 that is schematically evident from FIG. 2, of the opposite contact 20 and the drive electrode 30 of the electromechanical microswitch 1 is evident from the predetermination of an MEMS configuration according to the concept of the invention from the structure of the conductive levels of a multi-level conductive path layer stack which is applied to a surface of a silicon substrate. The contact pivot 10 is presently configured as a structuring of the conductive level M3 (third level of the membrane level conductive path layer stack), wherein the conductive level M3 again includes a sandwich structure made from a center metal layer and cover layers 19 covering the metal layer, wherein the cover layers in this embodiment are arranged on both sides of the metal layer and e.g. made from aluminum. The cover layers 19 in the present embodiment are made from a material based on titanium nitrate, in this case TiN. Besides the advantageous mechanical and protective properties, TiN also has excellent properties with respect to the contact properties of the contact zone 13 relative to the opposite contact 20. The bridge 14 thus according to FIG. 2 is configured as a three layer membrane which through the sandwich arrangement is substantially without tension or particularly well tension compensated in an advantageous manner. In some embodiments, the bridge 14 or the contact pivot 14 can also be configured with more than 3, for example as illustrated in FIG. 7 from five layers.

The drive electrode 30 is formed in each of its portions 31, 32 through structuring the conductive plane M1 which in this embodiment is also formed from aluminum and a cover layer 39 also made from titanium nitrate.

The opposite contact 20 presently includes a base 21 made from a layer of non-conductive or insulating material $Si_3N_4$. Onto the base 21, additional layers are applied through forming the conductive path M2 according to the contour of the opposite contact 20, since the conductive path M2 in turn is made from a sandwich structure of an aluminum carrier layer with intermediary layers 22, for example made from TiN applied on both sides. On the surface of the distal end 23 of the opposite contact 20, a sequence of initially one barrier layer 24 oriented towards the base and made from conductive material presently metallic TiN is applied and thereon a dielectric layer 25 and eventually a conductive cap 26 oriented towards the contact pivot 10. The MIM sequence of conductive layer 24, dielectric layer 25 and conductive cap 26 is presently configured as a particular protection of the opposite contact 20 for improving the contact properties to the contact 10 and for configuring a defined switching capability. Presently, the protective conductive cap 26 is formed from a thin metal layer made from TiN which is directly applied to the dielectric layer 25 through a respective structuring process. The cap 26 however in a modified embodiment not illustrated herein can also be made from a layer sequence of different metal materials. At least the surface which is formed by the cap 26 thus laterally reaches over the surface of the contact pivot 10 as apparent e.g. from FIG. 3. This provides particularly reliable contacting. The dielectric layer 25 for configuring the MIM structure can be formed in principle from any suitable dielectric material. Additionally, the dielectric layer itself is comparatively thin in order to achieve a precisely defined capacity Cs which influences the signal path. The concept illustrated herein thus provides that the RF signal is influenced in a "down condition" only by the capacity defined by the MIM structure and thus substantially independently from the transition resistance between contact zone 13 and cap 26.

With reference to FIG. 5, the electromechanical microswitch 1 is formed as a portion of an MEMS 100 presently completely according to the inventive concept in a BEoL process (Back End of Line process) of a standard CMOS-BiCMOS process. Thus a complete integration of an electromechanical microswitch together with electronic components is provided in one chip. The MEMS 100 includes a multi-level conductive path layer stack 102 that is arranged on a substrate 101 whose conductive levels M1 through M5 are partially structured in the surface portion 103 in order to configure conductive paths 111 through 115 for connecting the electronic components. The conductive paths M1 through M5 are insulated from one another through electrically insulating layers 103 and connected with one another through Via contacts 104. The electromechanical microswitch 1 is presently integrated in a recess 105 of the multi-level conductive path layer stack 102. Thus as apparent from the overview of the conductive levels M1, M2, M3, the contact pivot 10, the opposite contact 20 and the drive electrode 30 activating the contact pivot are respectively configured as a portion of the multi-level conductive path layer stack 102. While the portion of the transistor circuit 106 and/or 108 is produced in a FEoL process section on the substrate 101, connecting both with one another and with the electromechanical microswitch 1 is provided in the multi-level conductive path layer stack 102 in one BEoL process section. This direct low inductivity conductive connector is particularly advantageous for high frequencies of the RF signal. The conductive paths 111 through 115 are presently made from an aluminum material, the Vias 104 are made from a tungsten material and the insulating or other protective layers can be made from an $Si_3N_4$ material.

FIG. 6 illustrates a modified embodiment in a view that is comparable to FIG. 5. A modified microelectromechanical system 100 is illustrated in which like numerals are used for identical or similar components or components with identical or similar functions for simplicity reasons. In addition to arranging the contact 10 and the opposite contact 20 and the activating drive electrode 30, in the electromechanical system 100 of FIG. 6, another drive electrode 50 counter-activating the contact 10 is provided as a pullback electrode. The pullback electrode is presently integrated in a conductive level M4 evident from FIG. 5 of the multi-level conductive path layer stack 102. As evident from the arrows in the force transmitting portions 41, 42 (FIG. 3), the contact pivot 10 can be brought by the pullback electrode from a "down condition" in an accelerated manner into an "up condition" which significantly reduces the switching time of the electromechanical microswitch 1 in MEMS 100. Thus it is facilitated to switch radio frequencies even in a high GHz range without problems.

It is appreciated that associating the contact pivot 10, the activating drive electrode 30 and the opposite contact 20 relative to the conductive planes M3, M1, M2 in the present embodiments is not to be interpreted as a limitation, but can be selected in a variable manner. Thus, for example, the opposite contact 20 can also be arranged in a M3 metal layer and the activating drive electrode 30 can also be arranged in a conductive level M2. As a matter of principle, however, also the contact pivot 10 with respect to the surface of the silicon substrate 101 can be arranged below an activating drive electrode or below an opposite contact. Such embodiments are presently not illustrated explicitly. Additionally, the association of the contact pivot 10, the opposite electrode 20 and the drive electrode 30 of the electromechanical microswitch 1 with respect to the conductive path M1 through M5 of the multi-level conductive path layer stack 102 must not be performed sequentially, it is rather also possible that additional metal layers arranged between the contacts have no direct function in the electromechanical microswitch.

FIG. 7 illustrates a second embodiment of a MEMS 200 with an electromechanical microswitch 1 integrated according to the invention. The MEMS in turn includes a multi-level conductive path layer stack 202 arranged on a substrate 201, wherein the multi-level conductive path layer stack is covered by an $SiO_2$ layer 206, for example for applying applications. The portion 206 and/or 208 for transistor switching and similar is produced in one FEoL process step. In a BEoL process (BEoL), the conductive levels M1 through M5 and therefrom through structuring e.g. through etching the conductive paths 211, 212, 213, 214, 215 are formed and connected with one another in a suitable manner through Via contacts 204. Between the conductive levels M1 through M5 of the conductive path layer stack 202, electrically insulating layers 203 are alternatively arranged. The insulating layers 203 are presently made from $Si_3N_4$, which can also be easily processed in a BEoL process. The microswitch 1 is integrated in a recess 205 of the multi-level conductive path layer stack 202. The contact pivot 10, the opposite contact 20 and the drive electrodes 30 for the contact pivot 10 are presently formed by structuring the conductive levels M1 through M5. In the embodiment of FIG. 7, the conductive levels M1 through M5 are in a particularly preferred manner configured as a metal carrier layer, e.g. made from aluminum and double layers on both sides. The double layer presently includes a respective layer from Ti and a layer from TiN. On a side of the conductive levels M1 through M5 which is oriented to the substrate 101, the metal carrier layer e.g. made from aluminum is initially directly coated with a first layer made from TiN and this layer in turn is coated with a second layer made from Ti. On the side of the conductive levels M1, M2, M3, M4, M5 oriented away from the substrate 201, the cover layer configured as a double layer is not mirrored, this means initially the metal carrier layer, e.g. made from aluminum, is coated with Ti and then an external TiN layer is applied.

The opposite contact 20 is presently initially configured as a pedestal with a base which includes a layer sequence corresponding initially to the conductive level M1, thereon an insulating dielectric layer 21 and then the accordingly structured conductive level M2. Thus the uppermost TiN layer of the conductive level M2, with respect to the TiN substrate, simultaneously forms the lower end layer of the MIM structure, which is arranged on the opposite contact 20. The MIM structure additionally includes a dielectric layer 25 which includes, for example, TiN—$Si_3N_4$ and an additional TiN layer configured as a metal cap 26. The details of the MIM structure are illustrated in the enlarged detail of FIG. 7. It is apparent therefrom that the layer sequence 24, 25, 26 of the MIM layer includes a layer sequence of TiN, $Si_3N_4$ and TiN. This also has the consequence that, when configuring the capacitive coupling between the contact pivot 10 and the opposite contact 20, the lower Ti layer of the conductive level M3, wherein the lower Ti layer is oriented towards the substrate, and the TiN layer of the MIM structure, wherein the TiN layer is oriented away from the substrate, are oriented opposite to one another. It has become apparent that a potential formation between the TiN layer on one hand side and the TiN layer on the other hand side is particularly advantageous for an electromechanical microswitch of the embodiment according to FIG. 7.

Figure 8A:
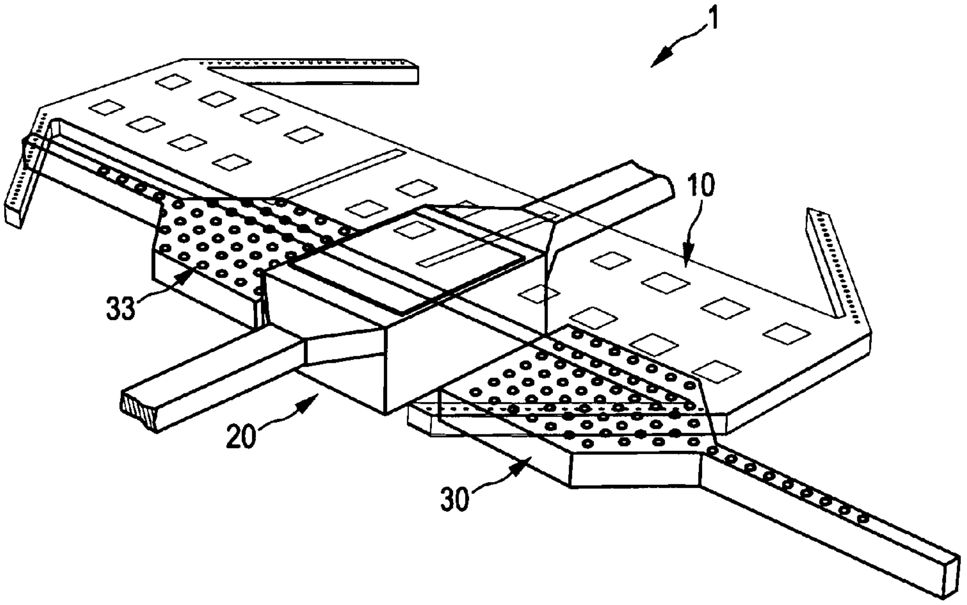
FIGS. 8A, 8B, 8C, 8D illustrate the electromechanical microswitch of FIG. 1 with a symbolic structure made from knobs with dielectric material (A) and electron microscope images in different enlargements (B), (C), (D) of the knob structure.
Figure 8B:
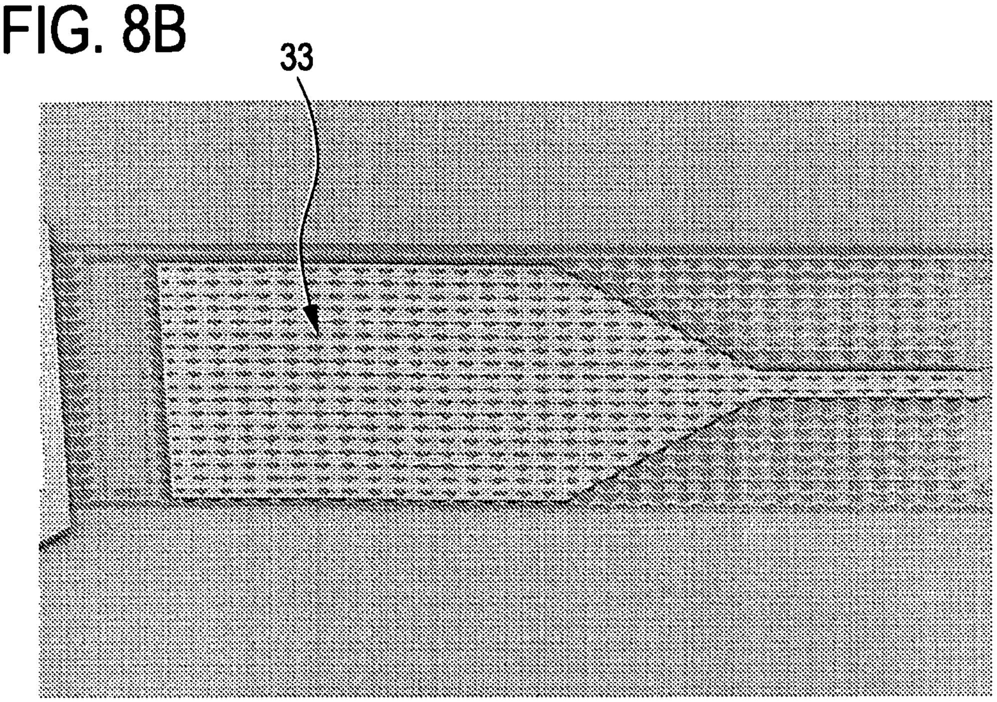
Figure 8C:
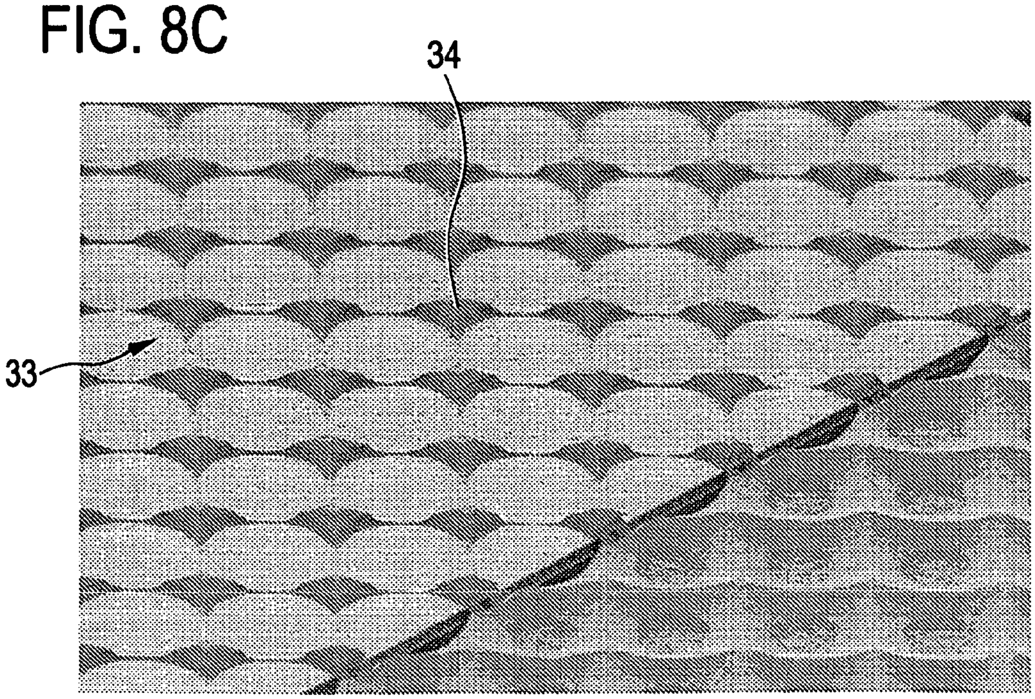
Figure 8D:
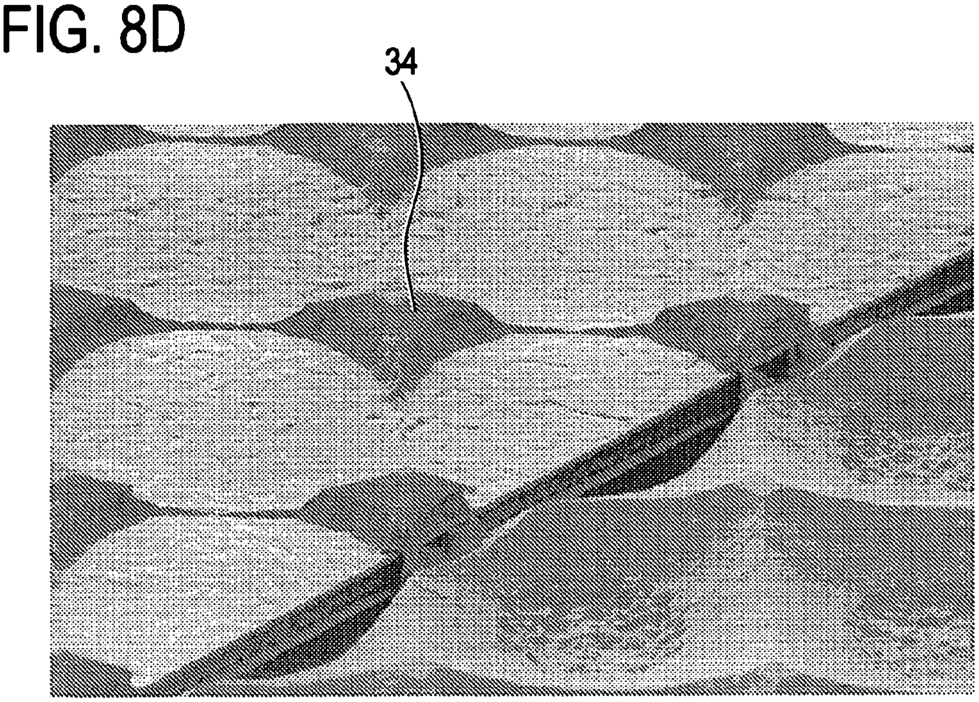

FIG. 8*a* illustrates an electromechanical microswitch 1, which is provided with a structure 33, including knobs 34, on a side of the activating drive electrode 30 that is oriented towards the contact pivot 10, wherein the structure is illustrated in more detail in the blown up illustrations of FIGS. 8*b, c, d*. These knobs that are also designated as dielectric islands or support posts can also be produced in an integrated manner without an additional process step, in particular without an extra mask in a typical BEoL process. Thus, a preferred method provides that the knob structure 34 remains as a residual of a wet chemical etching step and a subsequent CO2 drying step. The knobs prevent a contact between the contact zone 13 of the contact pivot 10 on the one hand side and of the activating drive electrode 30 on the other hand side. Thus, a short between the contact pivot 10 and the drive electrode 30 is advantageously prevented.

Figure 9:
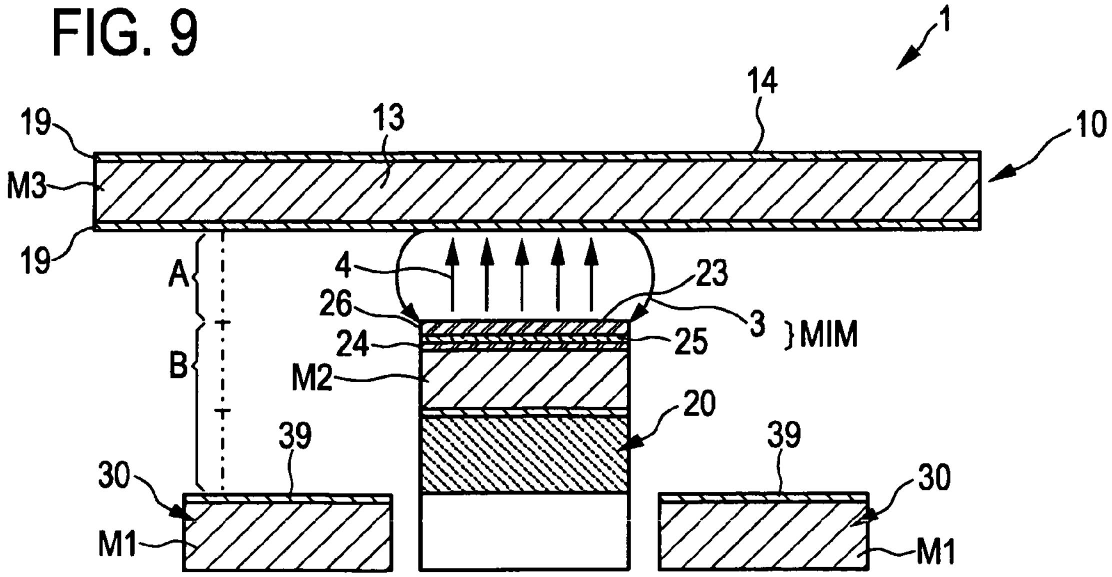
FIG. 9 illustrates a schematic view of the electromechanical microswitch similar to FIG. 2 with a symbolically illustrated movement direction of the contact pivot relative to the opposite contact and symbolically illustrated capacitive coupling and offset portions for implementing an area of a capacitive coupling that can be switched in a defined manner.

FIG. 9 illustrates the switching function of the electromechanical microswitch 1 based on the schematic illustration that was already shown in FIG. 2. In combination with FIG. 3, the capacitive coupling 4 between the contact zone 13 and the distal end 23 of the opposite contact 20 is changed for a movement of the contact pivot 10 in a direction of the opposite contact 20 based on the force in the force attractive portions 41, 42, wherein the force is caused by the drive electrode 30. The contact pivot 10 and the drive electrodes 30 are electrically connected through the accordingly configured conductive level M3 and Vias with the electronic circuit components of the MEMS. The capacitive coupling between the contact pivot 10 connected with ground potential and the opposite contact 20, which is connected with the RF signal path, is substantially only defined by the distance between the contact zone 30 and the cap 26 and by the dielectric layer 25 of the opposite contact 20, wherein the dielectric layer is configured as MIM structure. When the contact zone 13 contacts the cap 26 of the MIM structure on the opposite contact 20 in a "down condition" of the electromechanical microswitch 1, an effective contact between the contact zone 13 with the cover layer 19 made from Ti and the cap 26 made from TiN is established on the opposite contact 20. This facilitates a switching of the RF signal that is schematically illustrated in FIG. 4*a* and FIG. 4*b*. The distance between the cap 26 on the opposite contact 20 and the contact zone 13 of the contact pivot 10 is therefore smaller than the distance between the activating drive electrode 30 and the contact pivot 10, which requires a relatively large activation voltage (pull down voltage) between the activating drive electrode 30 and the contact pivot 10. The cap 26 made from TiN is automatically used as a stop layer for the contact zone 13 of the contact pivot 10 since there is an elevation difference between the opposite contact 20 and the drive electrode 30 that is apparent from FIG. 11.

Figure 10:
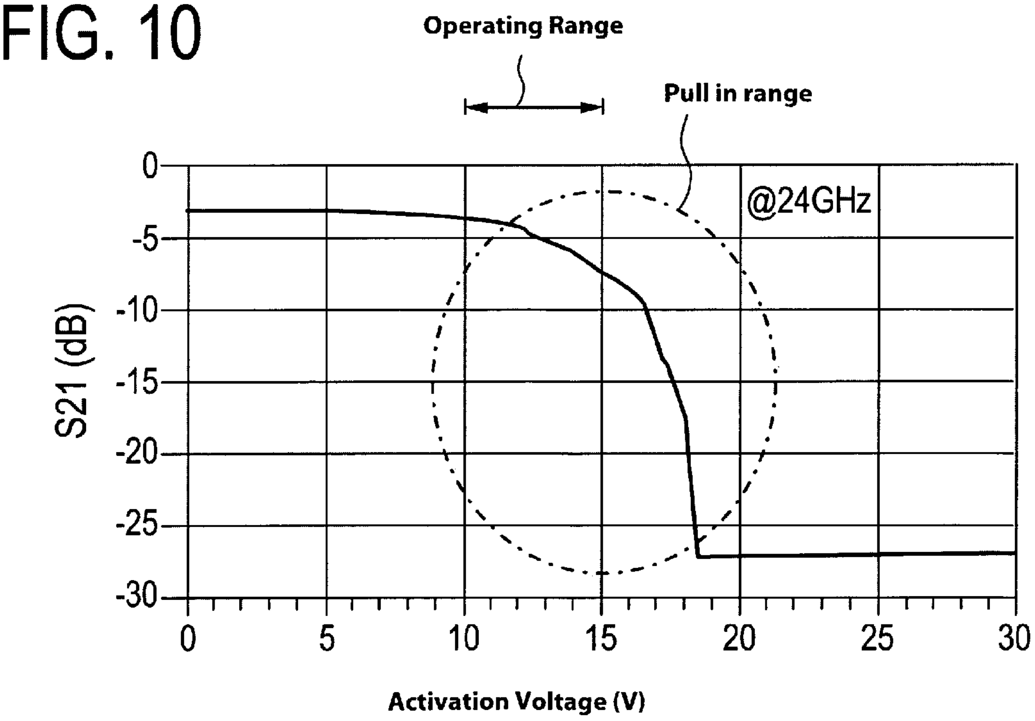
FIG. 10 illustrates an embodiment of a radio frequency characterization of an electromechanical microswitch of the preferred embodiment at 24 GHz with respect to switching properties.
Figure 11:
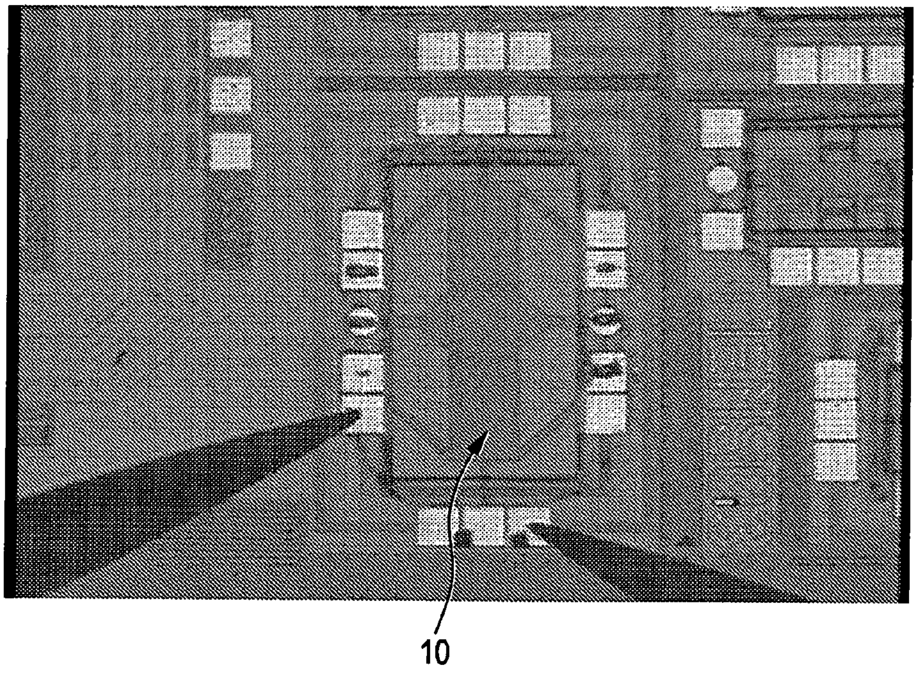
FIG. 11 illustrates the measuring arrangement for characterizing the MEMS of FIG. 10 with the electromechanical microswitch.

FIG. 10 illustrates an exemplary measurement regarding the switching properties of the electromechanical microswitch at 24 GHz over the distance A according to FIG. 9. The measuring assembly for the electromechanical microswitch is illustrated in FIG. 11. At 24 GHz, this leads to a damping of the RF signal by −25 dB and mechanically stable properties at an activation voltage of up to 30 V without unwanted blocking or adhesion of the contact 10 at the opposite contact 20 or the drive electrode 30 being determined. The so-called pull in voltage, this means the voltage at which the switch has transitioned from an "up condition" into a "down condition" is at 17 to 18 V at present. In an operating range of the activation voltage presently between 10 and 15 V, an almost linear diagram of the capacity between opposite electrode 20 and contact pivot 10 can be determined which is advantageous for an application of the electromechanical microswitch according to the invention as an adjustable capacity. A respective switching arrangement can be derived from FIG. 4*c*. The maximum DC voltage difference between the opposite contact 20 and the contact pivot 10 is accordingly less than the activation voltage (pull down voltage) between the activating drive electrode 20 and the contact pivot 10.

In summary, an electromechanical system (MEMS) 100, 200, including an electromechanical microswitch 1 for switching an electrical signal S in particular a radio frequency signal (RFMEMS) in particular in a GHz range has been described, including:

- a multi-level conductive path layer stack 102, 202, arranged on a substrate 101, 201, wherein the conductive paths 111 through 115, 211 through 215, in different conductive levels M1 through M5 are insulated from one another with electrically insulating layers 103, 203 and electrically connected with one another through Via contacts 104, 204,
- an electromechanical switch 1 which is integrated in a recess 105, 205 of the multi-level conductive path layer stack 102, 202 and which includes a contact pivot 10, an opposite contact 20 and at least one drive electrode 30, 50 for the contact pivot 10, wherein the contact pivot 10, the opposite contact 20 and the at least one drive electrode 30, 50 respectively form a portion of a conductive level M1 through M5 of the multi-level layer stack 102, 202. Overall, a microelectromechanical system (MEMS) 100, 200 that is integratable in a BEoL process and configured for radio frequency signals (RFMEMS) with an electromechanical microswitch 1 has been described. The system is advantageously configured with a sequence of a metal-insulator-metal-structure at a distal end 23 of the opposite contact 20 and the drive electrode 30 includes a knob structure with dielectric material on a side that is oriented towards the contact 10. On the one hand side, this achieves particularly advantageous switching properties as illustrated in FIG. 10, and on the other hand side unwanted blocking of the electromechanical microswitch 1 is prevented.

The invention claimed is:

1. A microelectromechanical system with an electromechanical microswitch for switching an electrical signal in particular a radio frequency signal, in particular in a GHz range, comprising:

- a multi-level conductive path layer stack arranged on a substrate, wherein conductive paths of the multi-level conductive path layer stack arranged in different conductive levels are insulated from one another through electrically insulating layers and electrically connected with one another through Via contacts,
- an electromechanical switch which is integrated in a recess of the multi-level conductive path layer stack and which includes a contact pivot, an opposite contact and at least one drive electrode for the contact pivot,
  - wherein the contact pivot, the opposite contact and the at least one drive electrode respectively form a portion of a conductive level of the multi-level layer stack, and
  - wherein the contact pivot of the electromechanical microswitch includes a contact zone and an attractive portion, in particular a partition configured as a slot or similar between the portions,
  - wherein the opposite contact of the electromechanical microswitch includes a base with at least one layer with insulating material and a MIM structure, including:
    - a barrier layer made from conductive material, in particular metal material, oriented towards the base;
    - a conductive cap oriented towards the contact pivot and arranged at a distal end; and
    - a dielectric layer arranged there between.

2. The microelectromechanical system according to claim 1, wherein the opposite contact includes a metal-insulator-metal structure at a distal end oriented towards the contact pivot.

3. The microelectromechanical system according to claim 1, wherein the electromechanical microswitch includes a first drive electrode activating the contact pivot and/or a second drive electrode counter-activating the contact pivot.

4. The microelectromechanical system according to claim 1,

- wherein the contact pivot is movable through a drive electrode, wherein a capacitive coupling is changed through a distance between the opposite contact and the contact pivot for influencing the electrical signal at least on the opposite contact due to an elastic movement of the contact pivot when applying an electrical potential between the drive electrode and the contact pivot.

5. The microelectromechanical system according to claim 1,

- wherein the conductive contact pivot and/or the opposite contact and/or the at least one drive electrode and/or a counter-activating drive electrode of the electromechanical microswitch, include a carrier layer that is formed by a conductive level of the multi-level conductive path layer stack,
- wherein the carrier layer includes one or plural layers with TiN and/or Ti and/or AlCu at least on one side.

6. The micromechanical system according to claim 5, wherein the carrier layer includes a double layer TiN—Ti.

7. The micromechanical system according to claim 5, wherein the carrier layer includes a sandwich made from TiN—AlCu—TiN.

8. The micromechanical system according to claim 5, wherein the conductive contact pivot, the opposite contact, the at least one device electrode, and the counter-activating drive electrode all include a carrier layer that is formed by a conductive level of the multi-level conductive path layer stack.

9. The microelectromechanical system according to claim 1, wherein the contact pivot is elastically movable, in particular cantilevered, preferably includes a contact zone which is part of an elastically movable conductive bridge or of a one- or double sided spring or of a similar cantilever.

10. The microelectromechanical system according to claim 1, wherein the at least one drive electrode of the electromechanical microswitch is arranged at a distance on a substrate side below the contact pivot.

11. The microelectromechanical system according to claim 1, wherein a counter-activating drive electrode of the electromechanical microswitch is arranged with an offset above the contact pivot on a side oriented away from the substrate.

12. The microelectromechanical system according to claim 1,

- wherein a first drive electrode of the electromechanical microswitch is configured as an activating drive electrode and a second drive electrode is configured as a counter-activating drive electrode
- wherein the first drive electrode and the second drive electrode are tuned to one another and configured to impact the contact pivot.

13. The microelectromechanical system according to claim 1, wherein the drive electrode provided for moving the contact pivot and/or another counter-activating drive electrode of the electromechanical microswitch are formed with a metal, in particular Al based carrier layer of a conductive level of a conductive path layer stack.

14. The microelectromechanical system according to claim 1, wherein the opposite contact of the electromechanical microswitch is formed as a solid pedestal on the substrate.

15. The microelectromechanical system according to claim 1, wherein at least one conductive layer of the MIM structure of the electromechanical microswitch, in particular a cap and/or a barrier layer is formed from a conductive metal layer or layer combination including a material that is based on titanium nitride and/or titanium.

16. The microelectromechanical system according to claim 1, wherein the at least one conductive layer of the MIM structure of the electromechanical microswitch is made from one or plural layers with TiN and/or Ti and/or AlCu, in particular a double layer TiN—Ti or in particular a sandwich made from TiN—AlCu—TiN.

17. The microelectromechanical system according to claim 1, wherein the dielectric layer of the MIM structure of the electromechanical microswitch is formed from one or plural layers with $Si_3N_4$.

18. The microelectromechanical system according to claim 1, wherein a distance from the contact pivot of a drive electrode activating the contact pivot is greater than a distance A of the contact pivot from the opposite contact.

19. The microelectromechanical system according to claim 1, wherein a distance between the opposite contact and the contact pivot is sized so that over the entire distance in an operating range an approximately linear context is provided between the activation voltage applied to the drive electrode and the contact pivot and the capacity provided between the contact pivot and the opposite electrode.

20. An integrated circuit, in particular an integrated CMOS circuit, including a microelectromechanical system according to claim 1.

21. A method for producing an integrated circuit according to claim 20 through a CMOS production process comprising the steps:

producing the integrated circuit in an FEoL process with a plurality of electronic circuit elements; and electrically contacting the electronic circuit elements in a BEoL process, wherein the electromechanical microswitch is integrated in the BEoL process in a recess of the multi-level conductive path layer stack, wherein the contact pivot, the opposite contact and the at least one drive electrode activating the contact pivot respectively form a portion of a conductive level of the multi-level conductive path layer stack.

22. The microelectromechanical system with an electromechanical microswitch for switching an electrical signal in particular a radio frequency signal, in particular in a GHz range, comprising:

a multi-level conductive path layer stack arranged on a substrate, wherein conductive paths of the multi-level conductive path layer stack arranged in different conductive levels are insulated from one another through electrically insulating layers and electrically connected with one another through Via contacts, an electromechanical switch which is integrated in a recess of the multi-level conductive path layer stack and which includes a contact pivot, an opposite contact and at least one drive electrode for the contact pivot, wherein the contact pivot, the opposite contact and the at least one drive electrode respectively form a portion of a conductive level of the multi-level layer stack, and, wherein the contact pivot of the electromechanical microswitch includes a contact zone and an attractive portion, in particular a partition configured as a slot or similar between the portions.

* * * * *